(12) United States Patent
Zhu et al.

(10) Patent No.: US 10,679,941 B2
(45) Date of Patent: Jun. 9, 2020

(54) METHOD FOR FORMING THREE-DIMENSIONAL INTEGRATED WIRING STRUCTURE AND SEMICONDUCTOR STRUCTURE THEREOF

(71) Applicant: Yangtze Memory Technologies Co., Ltd., Wuhan, Hubei (CN)

(72) Inventors: Jifeng Zhu, Hubei (CN); Jun Chen, Hubei (CN); Si Ping Hu, Hubei (CN); Zhenyu Lu, Hubei (CN)

(73) Assignee: Yangtze Memory Technologies Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/046,899

(22) Filed: Jul. 26, 2018

(65) Prior Publication Data
US 2019/0067196 A1 Feb. 28, 2019

Related U.S. Application Data

(63) Continuation of application No. PCT/CN2018/090475, filed on Jun. 8, 2018.

(30) Foreign Application Priority Data

Aug. 31, 2017 (CN) .......................... 2017 1 0775896

(51) Int. Cl.
*H01L 29/10* (2006.01)
*H01L 29/76* (2006.01)
(Continued)

(52) U.S. Cl.
CPC ...... *H01L 23/5283* (2013.01); *H01L 21/0262* (2013.01); *H01L 21/02271* (2013.01);
(Continued)

(58) Field of Classification Search
None
See application file for complete search history.

(56) References Cited

U.S. PATENT DOCUMENTS

2002/0132465 A1* 9/2002 Leedy ................ H01L 27/0688
                                                        438/618
2005/0167782 A1    8/2005 Sanchez et al.
(Continued)

FOREIGN PATENT DOCUMENTS

CN     101853832 A    10/2010
CN     104465570 A     3/2015
(Continued)

OTHER PUBLICATIONS

International Search Report and Written Opinion of the International Searching Authority directed to related International Patent Application No. PCT/CN2018/090475, dated Aug. 29, 2015; 7 pages.

*Primary Examiner* — Calvin Y Choi
(74) *Attorney, Agent, or Firm* — Sterne, Kessler, Goldstein & Fox P.L.L.C.

(57) ABSTRACT

Embodiments of methods and structures for forming a 3D integrated wiring structure are disclosed. The method can include forming an insulating layer on a front side of a first substrate; forming a semiconductor layer on a front side of the insulating layer; patterning the semiconductor layer to expose at least a portion of a surface of the insulating layer; forming a plurality of semiconductor structures over the front side of the first substrate, wherein the semiconductor structures include a plurality of conductive contacts and a first conductive layer; joining a second substrate with the semiconductor structures; performing a thinning process on a backside of the first substrate to expose the insulating layer and one end of the plurality of conductive contacts; and
(Continued)

forming a conductive wiring layer on the exposed insulating layer.

12 Claims, 5 Drawing Sheets

(51) Int. Cl.
  *H01L 31/036*      (2006.01)
  *H01L 31/112*      (2006.01)
  *H01L 27/108*      (2006.01)
  *H01L 23/528*      (2006.01)
  *H01L 21/02*       (2006.01)
  *H01L 21/768*      (2006.01)
  *H01L 21/683*      (2006.01)
  *H01L 21/3213*     (2006.01)
  *H01L 27/11556*    (2017.01)
  *H01L 27/11582*    (2017.01)
  *H01L 23/522*      (2006.01)
  *H01L 21/3105*     (2006.01)

(52) U.S. Cl.
  CPC .. *H01L 21/02488* (2013.01); *H01L 21/02532* (2013.01); *H01L 21/3213* (2013.01); *H01L 21/6835* (2013.01); *H01L 21/76892* (2013.01); *H01L 21/76895* (2013.01); *H01L 21/76898* (2013.01); *H01L 23/5226* (2013.01); *H01L 27/11556* (2013.01); *H01L 27/11582* (2013.01); *H01L 21/0217* (2013.01); *H01L 21/0223* (2013.01); *H01L 21/02164* (2013.01); *H01L 21/02211* (2013.01); *H01L 21/02255* (2013.01); *H01L 21/02595* (2013.01); *H01L 21/02598* (2013.01); *H01L 21/31053* (2013.01); *H01L 2221/68363* (2013.01); *H01L 2221/68381* (2013.01)

(56) References Cited

U.S. PATENT DOCUMENTS

| | | |
|---|---|---|
| 2010/0330743 A1 | 12/2010 | Yu et al. |
| 2011/0143506 A1* | 6/2011 | Lee ................. H01L 23/481 |
| | | 438/238 |
| 2015/0206936 A1 | 7/2015 | Huang |
| 2015/0364401 A1 | 12/2015 | Batra et al. |
| 2016/0035654 A1 | 2/2016 | Schneegans et al. |
| 2017/0104068 A1 | 4/2017 | Lee et al. |
| 2017/0194340 A1* | 7/2017 | Lue ................. H01L 27/11556 |

FOREIGN PATENT DOCUMENTS

| | | |
|---|---|---|
| CN | 104795354 A | 7/2015 |
| CN | 105336718 A | 2/2016 |
| CN | 10565532 A | 6/2016 |
| CN | 106920795 A | 7/2017 |
| CN | 107644839 A | 1/2018 |
| WO | WO-2019/041957 A1 | 3/2019 |

* cited by examiner

METHOD FOR FORMING THREE-DIMENSIONAL INTEGRATED WIRING STRUCTURE AND SEMICONDUCTOR STRUCTURE THEREOF

CROSS-REFERENCE TO RELATED APPLICATIONS

This application claims priority to Chinese Patent Application No. 201710775896.4 filed on Aug. 31, 2017 and PCT Application No. PCT/CN2018/090475 filed on Jun. 8, 2018, the entire content of which is incorporated herein by reference.

BACKGROUND

Embodiments of the present disclosure relate to the field of semiconductor manufacturing technology, and in particular to method for forming a 3D integrated wiring structure (e.g., a memory structure.)

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

BRIEF SUMMARY

Embodiments of methods for forming a 3D integrated wiring structure and semiconductor structures thereof are disclosed herein.

Disclosed is a method for forming a 3D integrated wiring structure, including: forming an insulating layer on a front side of a first substrate; forming a semiconductor layer on a front side of the insulating layer; patterning the semiconductor layer to expose at least a portion of a surface of the insulating layer; forming a plurality of semiconductor structures over the front side of the first substrate, wherein the semiconductor structures include a plurality of conductive contacts and a first conductive layer; joining a second substrate with the semiconductor structures; performing a thinning process on a backside of the first substrate to expose the insulating layer and one end of the plurality of conductive contacts; and forming a conductive wiring layer on the exposed insulating layer.

In some embodiments, the plurality of conductive contacts penetrates at least a portion of the semiconductor structures and the insulating layer in a vertical direction. In some embodiments, the plurality of conductive contacts connects to the conductive wiring layer at one end and connects to the first conductive layer at the other end.

In some embodiments, the method further includes forming a wiring pattern by etching the conductive wiring layer, and the wiring pattern is electrically connected to the plurality of conductive contacts.

In some embodiments, the method further includes disposing a passivation layer over the conductive wiring layer and the exposed insulating layer. In some embodiments, the disposing of a passivation layer includes lithography and etching.

In some embodiments, forming the semiconductor layer includes disposing polycrystalline silicon, or single crystalline silicon on a front side of the insulating layer.

In some embodiments, joining a second substrate with the semiconductor structures includes a bonding process including adhesive bonding, anodic bonding, direct wafer bonding, eutectic bonding, hybrid metal/dielectric bonding, or a combination thereof.

In some embodiments, forming the plurality of semiconductor structures includes forming a plurality of 3D memory structures. In some embodiments, forming the plurality of 3D memory structures includes forming a memory device layer, a first conductive layer, and a plurality of conductive contacts within the memory device layer connecting to the front side of the first substrate at one end and connecting to the first conductive layer at the other end.

In some embodiments, forming the plurality of 3D memory structures includes forming a plurality of stacked memory cells.

Another aspect of the present disclosure provides a structure, including: an insulating layer; a patterned semiconductor layer disposed on a front side of the insulating layer; a plurality of semiconductor structures formed on at least a portion of the patterned semiconductor layer and the insulating layer, wherein the plurality of semiconductor structures includes a plurality of conductive contacts and a first conductive layer; and a conductive wiring layer disposed on a backside of the insulating layer.

In some embodiments, the structure further includes a first substrate on the backside of the insulating layer. In some embodiment, at least a portion of the first substrate includes a reduced thickness. In some embodiments, at least a portion of the first substrate is removed to expose at least a portion of the backside of the insulating layer.

In some embodiments, the structure further includes a second substrate joined to a front side of the plurality of semiconductor structures.

In some embodiments, the plurality of conductive contacts connects to the conductive wiring layer at one end and connects to the first conductive layer at the other end.

In some embodiments, the structure further includes a passivation layer disposed on the conductive wiring layer and the exposed insulating layer.

In some embodiments, a thickness of the insulating layer is between about 0.3 μm and 5 μm.

In some embodiments, the patterned semiconductor layer includes single crystalline silicon, or polycrystalline silicon.

In some embodiments, a thickness of the patterned semiconductor layer is between about 0.03 μm and 1 μm.

In some embodiments, the plurality of conductive contacts and conductive wiring layer include copper, silver, aluminum, tin, tungsten, or a combination thereof.

In some embodiments, a diameter of the conductive contact is between about 0.3 μm and 5 μm.

In some embodiments, the plurality of semiconductor structures includes a plurality of 3D memory structures.

In some embodiments, the plurality of 3D memory structures includes a memory device layer having a plurality of stacked memory cells, a plurality of conductive contacts, and a first conductive layer. In some embodiments, the plurality of conductive contacts connects to the conductive wiring layer at one end and connects to the first conductive layer at the other end.

In some embodiments, a thickness of the 3D memory device structure is between about 1 μm and 50 μm.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
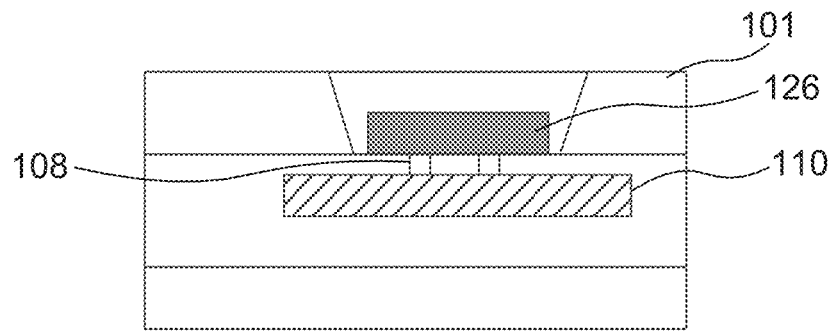
FIG. 1 illustrates a wiring method.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "contact" can broadly include any suitable types of interconnects, such as middle-end-of-line (MEOL) interconnects and back-end-of-line (BEOL) interconnects, including vertical interconnect accesses (e.g., vias) and lateral lines (e.g., interconnect lines).

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "vertical/vertically" means nominally perpendicular to a lateral surface of a substrate.

As used herein, the term "3D memory device" refers to a semiconductor device with vertically-oriented strings of memory cell transistors (referred to herein as "memory strings," such as NAND strings) on a laterally-oriented substrate so that the memory strings extend in the vertical direction with respect to the substrate.

Figure 2:
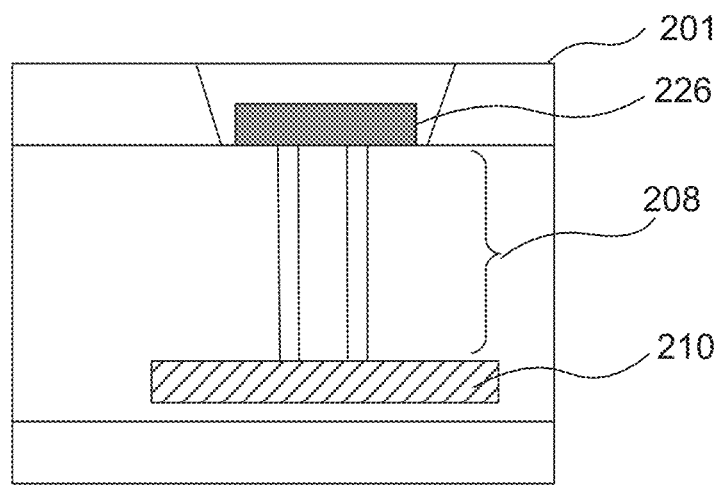
FIG. 2 illustrates a wiring method for forming a 3D semiconductor structure.

As shown in FIG. 1, current wafer wiring technology includes etching directly from the backside of a wafer 101, exposing a first conductive layer ($M_1$) 110 and forming an electrical connection between a conductive wiring layer 126 and the first conductive layer 110 through vias 108. As shown in FIG. 2, in current 3D memory technology, the memory cell is fabricated perpendicularly to the wafer surface, forming a thick semiconductor device layer 208 with a thickness up to about 5 microns (μm), between a conductive wiring layer 226 and a first conductive layer 210, which makes forming an electrical contact between the conductive wiring layer 226 and the first conductive layer 210 challenging using traditional wiring techniques.

Various embodiments in accordance with the present disclosure provide a method for forming a 3D integration wiring structure and a semiconductor device with an interconnect structure. The method for forming a 3D integrated wiring structure disclosed herein can include forming an insulating layer on a front side of a first substrate; forming a semiconductor layer on a front side of the insulating layer; patterning the semiconductor layer to expose at least a portion of a surface of the insulating layer; forming a plurality of semiconductor structures, including a plurality of conductive contacts and a first conductive layer, over the front side of the first substrate; joining a second substrate with the semiconductor structures; performing a thinning process on a backside of the first substrate to expose the insulating layer and one end of the plurality of conductive contacts; and forming a conductive wiring layer on the exposed insulating layer. As a result, the method for forming a 3D integrated wiring structure disclosed herein can provide an interconnect structure and enable wiring through a thick semiconductor device layer to streamline fabrication process, reduce production cost and improve device quality.

Figure 3:
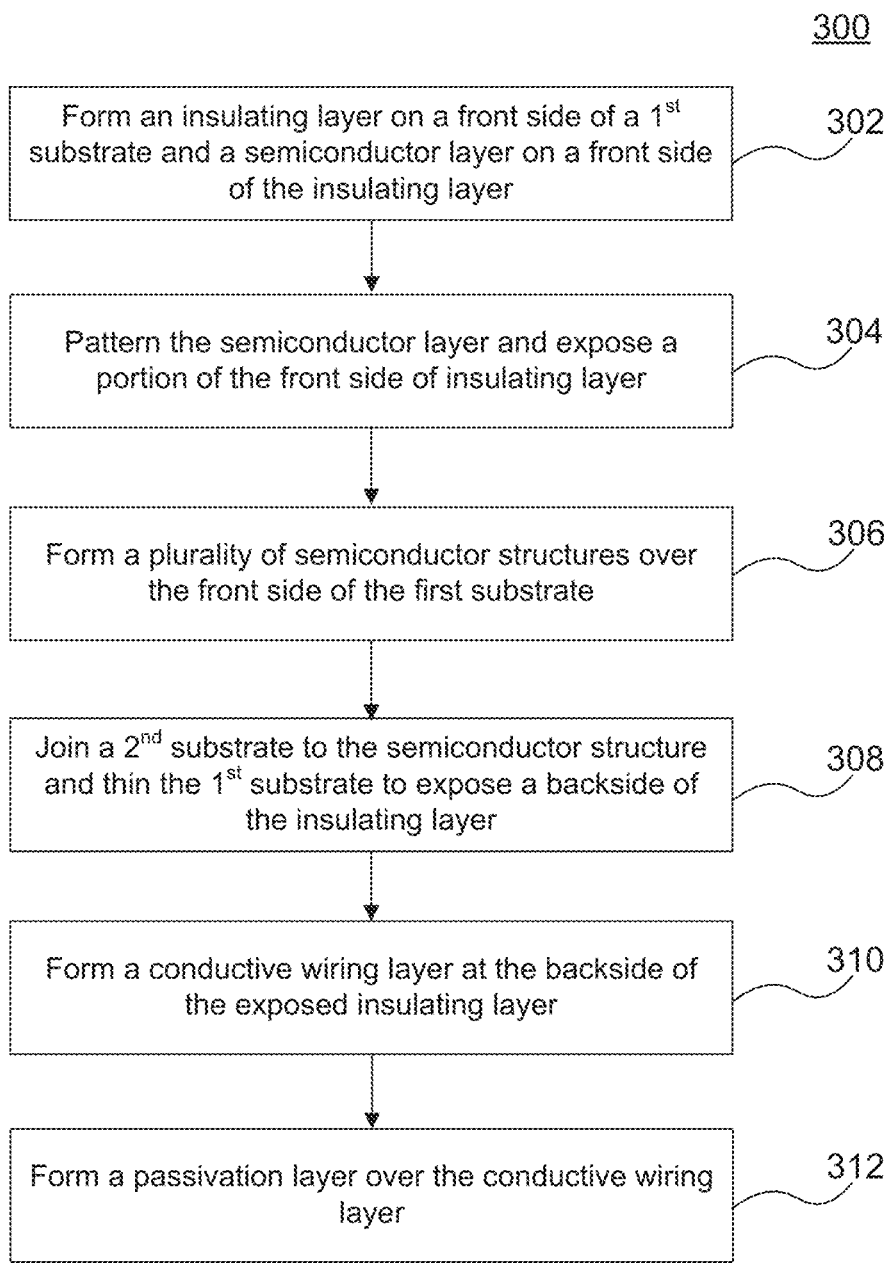
FIG. 3 is a flowchart of an exemplary wiring method for forming a 3D integrated wiring structure, according to some embodiments of the present disclosure.

FIG. 3 is a flowchart of an exemplary integrated wiring method 300 for forming a 3D memory device, according to some embodiments of the present disclosure. FIGS. 4-9 illustrate an exemplary fabrication method to form a 3D memory device, according to some embodiments of the present disclosure. It should be understood that the steps shown in method 300 and the fabrication method shown in FIGS. 4-9 are not exhaustive and that other methods and steps can be performed as well before, after, or between any of the illustrated methods and steps.

Figure 4:
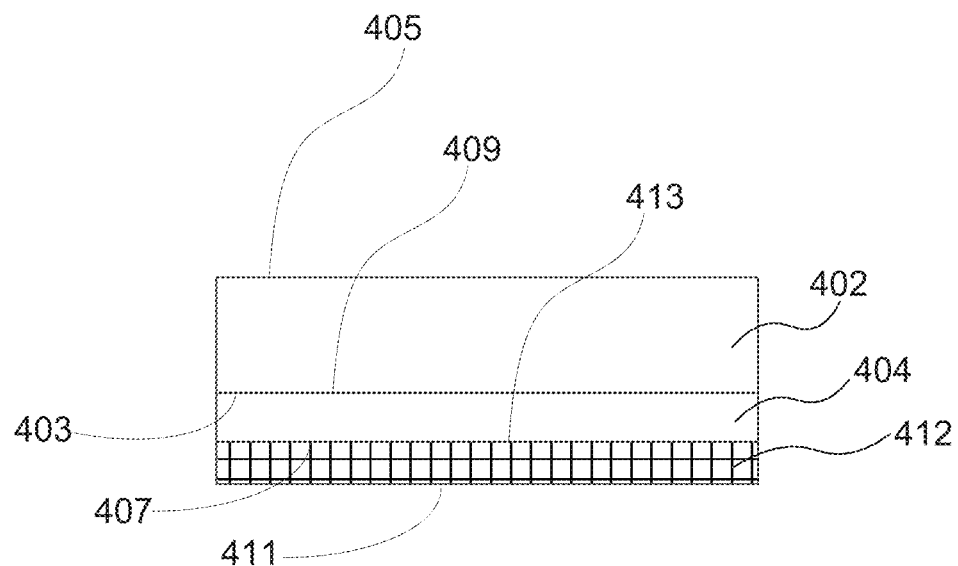
FIGS. 4-9 illustrate an exemplary fabrication process for forming a 3D integrated wiring structure, according to some embodiments of the present disclosure.

Referring to FIG. 3 and FIG. 4, method 300 starts at step 302, in which an insulating layer 404 is formed on a front side 403 of a first substrate 402 and a semiconductor layer 412 is formed on a front side 407 of the insulating layer 404. As used herein, the term "front side" of a structure refers to the side of the structure at which a device is formed. Conversely, as used herein, the term "backside" refers to the side of the structure that is opposite to the front side. For ease of illustration, structures of the first substrate 402, the insulating layer 404, and the semiconductor layer 412 are shown upside down such that a backside 405 of the first substrate 402 is above a front side 403 of the first substrate 402; the backside 409 of the insulating layer 404 is above a front side 407 of the insulating layer 404; and the backside 413 of the semiconductor layer 412 is above the front side 411 of the semiconductor layer 412. It is worth to note that the backside 409 of the insulating layer 404 merges with the front side 403 of the first substrate 402 and the backside 413 of the semiconductor layer 412 merges with the front side 407 of the insulating layer 404.

The materials of the first substrate 402 or the semiconductor layer 412 can include silicon, germanium, a III-V semiconductor, silicon carbide, silicon on insulating substrate, or a combination thereof. In some embodiments, the first substrate 402 can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. In some embodiments, the first substrate 402 is a silicon wafer. In some embodiments, the semiconductor layer 412 comprises polycrystalline silicon or single crystalline silicon, or a combination thereof. The method for forming the semiconductor layer 412 comprises one or more thin film deposition processes, such as ALD (Atomic Layer Deposition), CVD (Chemical Vapor Deposition), LPCVD (Low pressure chemical vapor deposition), PVD (Physical Vapor Deposition), or a combination thereof.

An exemplary fabrication method to form the insulating layer 404 by CVD is disclosed as follows. The CVD is performed at a deposition pressure of 1600-1700 mtorr, flux of ammonia and/or oxygen of 5000-8000 sccm, flux of SiH4 of 800-1500 mtorr, RF power of 5500-7500 watt, and deposition temperature of 450-500° C.

An exemplary fabrication method to form the insulating layer 404 by thermal oxidation is disclosed as follows. Thermal oxidation process can include dry oxidation or wet oxidation, wherein the dry oxidation is performed at oxygen flux of 0.29-1.55 L/min, nitrogen flux of 2-18 L/min, pressure of 0.51-1.51 atm, temperature of 710-790° C., and the wet oxidation is performed at water vapor flux of 0.11-0.99 L/min, nitrogen flux of 1.5-18.5 L/min, pressure of 0.55-1.4 atm, and temperature of 720-750° C.

An exemplary fabrication method to form the semiconductor layer 412 comprising polycrystalline silicon by LPCVD is disclosed as follows. In some embodiments, the LPCVD is performed with a reaction gas of $SiH_4$, chamber temperature of 710-740° C., chamber pressure of 255-345 mtorr, SiH4 flux of 110-190 sccm. The reaction gas can further include a buffer gas comprising Ar and the flux of the Ar gas is 5.1-19 L/min. In some embodiments, the LPCVD is performed with a reaction gas of $SiH_4$, chamber temperature of 610-640° C., chamber pressure of 251-345 mtorr, $SiH_4$ flux of 110-199 sccm. The reaction gas can further include a buffer gas comprising Ar and the flux of the Ar gas is 5.5-18 L/min. In some embodiments, the LPCVD is performed with a reaction gas of $SiH_4$, chamber temperature of 690-710° C., chamber pressure of 460-540 mtorr, $SiH_4$ flux of 145-235 sccm. The reaction gas can further include a buffer gas comprising Ar and the flux of the Ar gas is 11-29 L/min. In some embodiments, the LPCVD is performed with a reaction gas of $SiH_4$, chamber temperature of 650-680° C., chamber pressure of 450-550 mtorr, $SiH_4$ flux of 150-250 sccm. The reaction gas can further include a buffer gas comprising Ar and the flux of the Ar gas is 15-20 L/min.

In some embodiments, the thickness of the semiconductor layer 412 is between about 0.03 μm and 1 μm. In some embodiments, the thickness of the semiconductor layer 412 is between about 0.03 μm and 0.1 μm. In some embodiments, the thickness of the semiconductor layer 412 is between about 0.05 μm and 1 μm.

In some embodiments, the material for the insulating layer 404 can include oxides, nitrides, oxynitrides or a combination thereof. In some embodiments, the method for forming the insulating layer 404 comprises thermal oxidation, thermal nitridation, thermal oxynitridation, CVD, PVD, or a combination thereof. In some embodiments, the method for forming the insulating layer further comprises planarizing or flattening a surface of the insulating layer 404 via Chemical Mechanical Polishing (CMP).

In some embodiments, the thickness of the insulating layer is between 0.3 µm and 5 µm. In some embodiments, the thickness of the insulating layer is between 0.3 µm and 1 µm. In some embodiments, the thickness of the insulating layer is between 0.1 µm and 3 µm. In some embodiments, the thickness of the insulating layer is about 1 µm.

Figure 5:
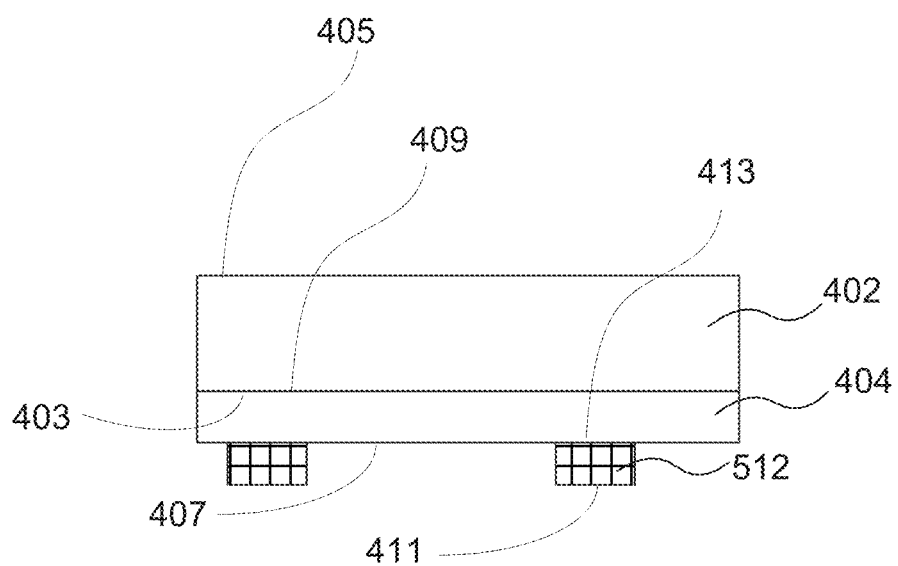

Referring to FIG. 3, method 300 proceed to step 304, in which the semiconductor layer is patterned. As illustrated in FIG. 5, a method to form the patterned semiconductor layer 512 includes, but not limited to, lithography, etching, deposition, polishing, CMP or a combination thereof. In some embodiments, a dielectric layer covers the semiconductor layer 412 (shown in FIG. 4) and a front side 407 of the insulating layer 404 followed by exposing a front side 411 of the semiconductor layer 412 through deposition, etching or optionally CMP to form to form the patterned semiconductor layer 512.

Figure 6:
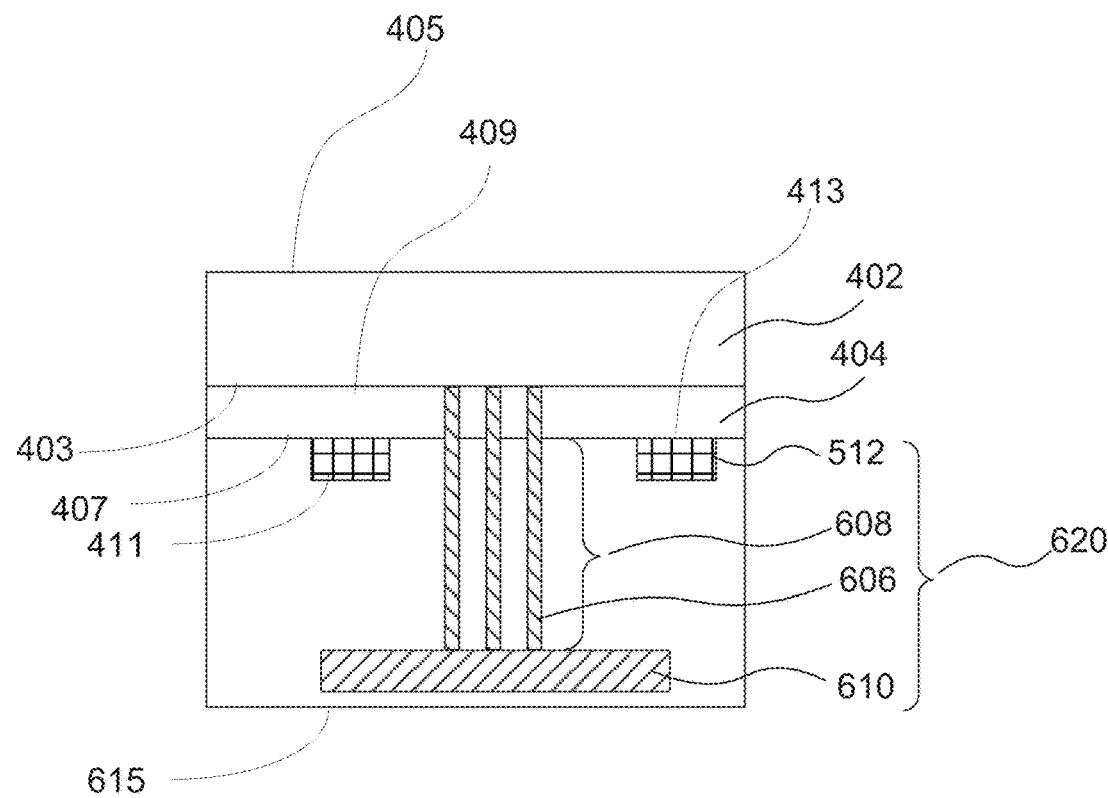

Referring to FIG. 3 and FIG. 6, method 300 proceeds to step 306, in which a plurality of semiconductor structures 620 is formed at the front side 407 of the insulating layer 404, over the front side of the first substrate. As illustrated in FIG. 6, a plurality of semiconductor structures 620 can include the patterned semiconductor layer 512, a semiconductor device layer 608 at the front side 407 of the insulating layer 404, a plurality of conductive contacts 606 (through array contacts (TACs) or contact vias) formed within the semiconductor device layer 608, and a first conductive layer 610 ($M_1$). The insulating layer 404 is between the front side 403 of the first substrate 402 and the semiconductor structure 620. As used herein, the term "front side" of a structure refers to the side of the structure at which a semiconductor structure is formed. In some embodiments, the conductive contacts 606 extend vertically into the insulating layer 404. In some embodiments, the conductive contacts 606 extend vertically into the semiconductor layer 404 and contact to the front side of the first substrate. In some embodiments, the length of the conductive contacts 606 ranges from about 0.5 µm to 5 µm. In some embodiments, the length of the conductive contacts 606 ranges from about 0.5 µm to 1 µm. In some embodiments, the diameter of the conductive contacts 606 is between about 0.3 µm and 5 µm. In some embodiments, the diameter of the conductive contacts 606 is between about 0.3 µm and 1 µm. In some embodiments, the thickness of patterned semiconductor layer 512 is between about 0.03 µm and 1 µm.

In some embodiments, the semiconductor structure 620 is a memory array structure. In some embodiments, the semiconductor structure is a 3D memory structure. In some embodiments, the semiconductor device layer 608 can include a memory stack. In some embodiments, the semiconductor device layer 608 is a memory device layer. In some embodiments, the memory stack is formed by repeatedly stacking a plurality of memory cells. In some embodiments, the thickness of the semiconductor device layer 608 is between about 1 µm and 50 µm. In some embodiments, the thickness of the semiconductor device layer 608 is between about 1 µm and 10 µm. In some embodiments, the thickness of the semiconductor device layer 608 is between about 5 µm and 50 µm. In some embodiments, the thickness of the semiconductor device layer 608 is about 5 µm. In some embodiments, the thickness of the semiconductor device layer 608 is greater than 5 µm.

In some embodiments, memory array stack is formed by multiple fabrication methods, including, but not limited to, thin film deposition of dielectric layers, etching of channel holes and slits, thin film deposition of memory films in the channel holes, and gate and word line replacement. In some embodiments, memory array stack can be formed (e.g., disposed) at the front side 403 of the first substrate 402 and can include an alternating conductor/dielectric stack and an array of NAND strings extending through the alternating conductor/dielectric stack. The alternating conductor/dielectric stack can include alternating conductor layers (e.g., metal layers or polysilicon layers) and dielectric layers (e.g., silicon oxide layers or silicon nitride layers). Each NAND string can include a plurality of vertically-stacked memory cells each controlled by a respective conductor layer (functioning as a control gate) of the alternating conductor/dielectric stack that surrounds the NAND string. The conductor layers in the alternating conductor/dielectric stack can extend in the lateral direction outside the memory array region to thereby form word lines of the semiconductor structure 620 (e.g., memory array structure). Each NAND string can also include a drain at an end (e.g., at the front side 615 of the semiconductor structure 620). The drain of each NAND string can be electrically connected to a respective one of a plurality of bit lines of the semiconductor structure 620. In some embodiments, each NAND string further includes multiple select gates (e.g., a source select gate and a drain select gate). Some structures described in this paragraph are not shown in FIG. 6 as they would be appreciated by a person skilled in the pertinent art.

The semiconductor structure 620 can include one or more conductive contacts 606 (TACs or contact vias) each extending vertically through at least part of the semiconductor structure 620. In some embodiments, conductive contacts 606 can extend vertically through the entire thickness of the semiconductor structure 620. For example, the conductive contacts 606 can pass through the entire thickness of the semiconductor device layer 608, the entire thickness of the insulating layer 404 and part of the entire thickness of the first substrate 402. In some embodiments, the conductive contacts 606 can pass through the entire thickness of the semiconductor device layer 608 and part of the entire thickness of the insulating layer 404. In some embodiments, the conductive contacts 606 can pass through the entire thickness of the semiconductor device layer 608 and the entire thickness of the insulating layer 404 so that the conductive contacts 606 reach the backside 409 of the insulating layer 404. In some embodiments, the conductive contacts 606 can pass through part of the entire thickness of the semiconductor device layer 608 without reaching to the first substrate 402. In some embodiments, the conductive contacts 606 is in contact with the first substrate 402 at the side 403, and in contact with the first conductive layer 610 at the other end. In some embodiments, the conductive contacts penetrate at least a portion of the semiconductor structures and the insulating layer in a vertical direction.

Each conductive contact 606 can include a vertical opening filled with conductor materials, including, but not limited to, tungsten (W), cobalt (Co), copper (Cu), aluminum (Al), doped silicon, silicides, a metal oxide (e.g. titanium oxide), a metal nitride (e.g titanium nitride) or a combination thereof.

In some embodiments, the diameter of the conductive contacts is between about 0.3 µm and 5 µm. In some embodiments, the diameter of the conductive contacts is between about 0.3 µm and 1 µm. In some embodiments, the diameter of the conductive contacts is about 1 µm.

The conductive contacts 606 can be in the memory array region and/or outside the memory array region, for example, in a staircase region of the semiconductor structure 620. The conductive contacts 606 can form electrical connection with word line contacts, bit line contacts, and gate select contacts. The word line contacts can be in the staircase region and electrically connect to the word lines, such that each word line contact can individually address the corresponding word line. The bit line contacts can electrically connect to the NAND strings by the bit lines, such that each bit line contact can individually address the corresponding NAND string. The gate select contacts can electrically connect to the select gates. Some structures described in this paragraph are not shown in FIG. 6, as they would be appreciated by a person skilled in the pertinent art.

The semiconductor structure 620 can include a first conductive layer 610 at the front side of the semiconductor structure 620. The first conductive layer 610 can provide connection to the memory array structure and/or the peripheral device structure. The first conductive layer 610 can be patterned based on the layout of the internal structure of memory array device and/or the peripheral device structure, so that suitable interconnect structures can be formed. The first conductive layer 610 can include, but not limited to, W, Co, Cu, Al, metal silicides, or any other suitable materials.

Figure 7:
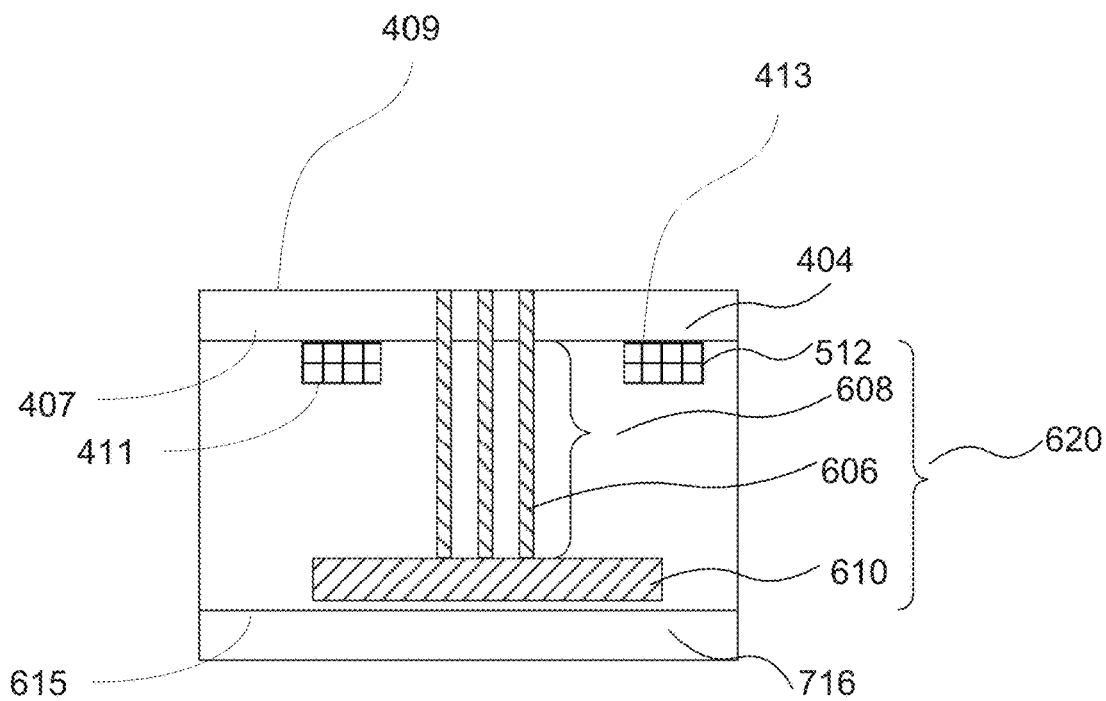

Referring to FIG. 3 and FIG. 7, method 300 proceeds to step 308, in which a second substrate 716 is joined to the semiconductor structure 620, followed by a thinning process of the first substrate 402. As illustrated in FIG. 7, a second substrate 716 can be bonded to the semiconductor structure 620 through adhesive bonding, anodic bonding, direct wafer bonding, eutectic bonding, hybrid metal/dielectric bonding or a combination thereof. Adhesive bonding, also referred to as gluing or glue bonding, is a wafer bonding technique with applying an intermediate layer to connect substrates of different materials. Anodic bonding is a wafer bonding process to seal glass to either silicon or metal without introducing an intermediate layer, which is commonly used to seal glass to silicon wafers in electronics and microfluidics, through electric fields. Direct bonding, also referred to as fusion bonding, is a wafer bonding process without any additional intermediate layers. The direct bonding process is based on chemical bonds between two surfaces of material meeting specific requirements. The direct bonding process can include wafer preprocessing, pre-bonding at room temperature and annealing at elevated temperatures. Eutectic bonding, also referred to as eutectic soldering, is a wafer bonding technique with an intermediate metal layer that can produce a eutectic system. Hybrid bonding, also known as "metal/dielectric hybrid bonding," can be a direct bonding technology (e.g., forming bonding between surfaces without using intermediate layers, such as solder or adhesives), which obtains metal-metal bonding and dielectric-dielectric bonding simultaneously.

The materials of the second substrate 716 can be silicon, germanium, a III-V semiconductor, silicon carbide, glass, plastic film, or silicon on insulating substrate, or a combination thereof. In some embodiments, the second substrate 716 can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. In some embodiments, the second substrate 716 is silicon wafer.

Then the first substrate 402 is thinned from the backside 405 (shown in FIG. 6) through techniques including, but not limited to, mechanical grinding (e.g., polishing), chemical mechanical planarization, wet etching and atmospheric downstream plasma dry chemical etching. a combination thereof.

In some embodiments, the thinning process removes the first substrate 402. In some embodiments, the thinning process removes at least a portion of the first substrate 402. In some embodiments, the thinning process removes the first substrate 402 and reduces the thickness of the insulating layer 404 from an initial range of about 0.3-5 μm down to a final range of about 0.01-4.99 μm. In some embodiments, the thinning process removes the first substrate 402 and reduces the thickness of the insulating layer 404 from an initial range of about 0.3-5 μm down to a final range of about 0.01-1 μm.

In some embodiments, the thinning process reduces the first substrate 402 (e.g., silicon wafer) thickness from an initial range about 400-700 μm down to a final range of about 150-250 μm. In some embodiments, the thinning process reduces the first substrate 402 (e.g., silicon wafer) thickness from an initial range about 400-700 μm range down to a final range of about 100-150 μm. In some embodiments, the thinning process reduces the first substrate 402 (e.g., silicon wafer) thickness of an initial about 400-700 μm range down to a final range less than about 100 μm.

Figure 8:
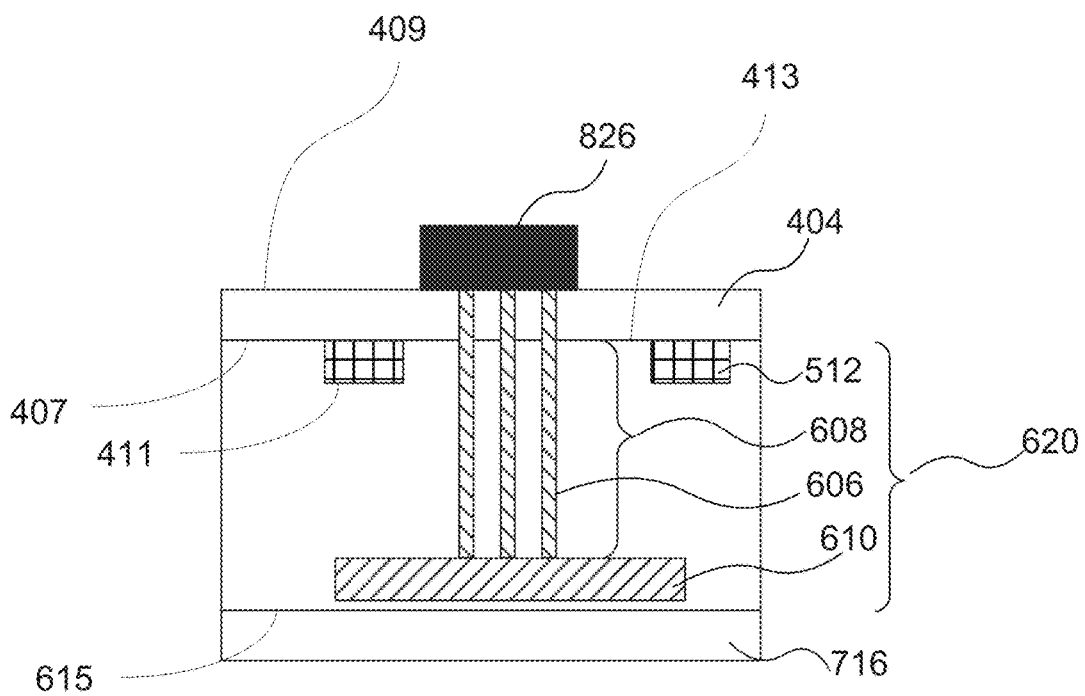

Referring to FIG. 3, method 300 proceeds to step 310, in which a conductive wiring layer is formed on the exposed insulating layer. As illustrated in FIG. 8, a conductive layer is disposed on the backside 409 the insulating layer 404 and patterned through photolithography and etching to form a conductive wiring layer 826. In some embodiments, the conductive wiring layer 826 can form an electrical connection with the semiconductor device layer 608, the first conductive layer 610, and/or the second substrate 716. The conductive wiring layer 826 can be patterned based on the layout of the internal structure of memory array device and/or the peripheral device structure, so that suitable interconnect structures can be formed. In some embodiments, a wiring pattern is formed by etching the conductive wiring layer. In some embodiments, the wiring pattern is electrically connected to the plurality of conductive contacts. The conductive wiring layer 826 can include, but not limited to, W, Co, Cu, Al, Ag, Sn, metal silicides, or any other suitable materials. In some embodiments, the conductive wiring layer 826 can include Cu, Ag, Al, Sn, W, or a combination thereof. In some embodiments, the conductive wiring layer 826 are in or on one or more back-end-of-line (BEOL) interconnect layers (not shown) at the backside of the semiconductor structure 620.

In some embodiments, to reduce stress caused by the conductive wiring layer 826, the distance in the vertical direction between the conductive wiring layer 826 and the semiconductor device layer 608 is about 3 μm. In some embodiments, the vertical distance between the conductive wiring layer 826 and the semiconductor device layer 608 is between about 3 μm and 10 μm (e.g., about 3 μm, about 4 μm, about 5 μm, about 6 μm, about 7 μm, about 8 μm, about 9 μm, about 10 μm, in any range bounded on the lower end defined by any of these values, or in any range defined by any two of these values). In some embodiments, the conductive wiring layer 826 can completely overlap the semiconductor structure 620. In some embodiments, the conductive wiring layer 826 can partially overlap the semiconductor structure 620. In some embodiments, the conductive wiring layer is electrically connected to the first conductive layer. In some embodiments, the conductive wiring layer is electrically isolated from the first substrate.

Figure 9:
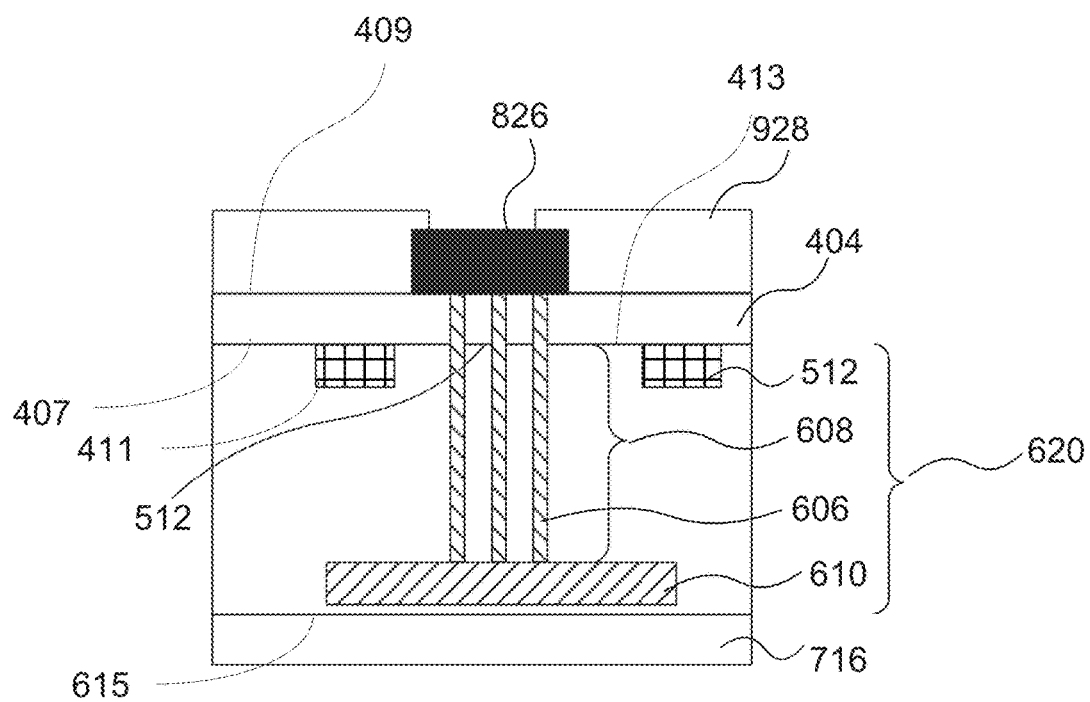

Referring to FIG. 3, method 300 proceeds to step 312, in which a passivation layer is formed over the conductive wiring layer and the exposed insulating layer. As illustrated in FIG. 9, the passivation layer 928 is formed over the backside 409 of the insulating layer 404 and the conductive wiring layer 826. The dielectric material of the passivation layer 928 can include oxides, nitrides, oxynitrides, or a combination thereof. In some embodiments, the passivation layer 928 includes silicon oxide, silicon nitride, silicon oxynitride, or a combination thereof. The passivation layer 928 can be formed by one or more thin film deposition methods, such as ALD, CVD, PVD, or a combination thereof, lithography and etching. In some embodiment, the forming of the passivation layer 928 further comprises CMP to planarize or flatten a surface of the passivation layer 928. In some embodiment, the passivation layer 928 is formed via CVD wherein the CVD is performed at deposition pressure of 1600-1700 mtorr, NH3 gas flow and/or oxygen gas flow of 5000-8000 sccm, SiH4 flow of 800-1150 sccm, RF power of 5500-7500 watt, and deposition temperature of 450-500° C. In some embodiments, the thickness of the passivation layer is between about 0.3 µm and 5 µm. In some embodiments, the thickness of the passivation layer is between about 0.3 µm and 1 µm. In some embodiments, the thickness of the passivation layer is about 1 µm. The passivation layer 928 can be further patterned via lithography and etching based on the layout of the internal structure of memory array device and/or the peripheral device structure, so that suitable interconnect structures can be formed.

In some embodiments, the 3D memory device can further include a peripheral device structure (not shown) on the second substrate 716, which are positioned face to face with their front sides facing towards the memory array structure. The peripheral device can include any suitable digital, analog, and/or mixed-signal peripheral circuits used for facilitating the step of 3D memory device. For example, the peripheral device can include one or more of a page buffer, a decoder (e.g., a row decoder and a column decoder), a driver, a charge pump, a current or voltage reference, or any active or passive components of the circuits (e.g., transistors, diodes, resistors, or capacitors). In some embodiments, the peripheral device is formed using CMOS technology.

In some embodiments, a 3D integrated wiring structure of a semiconductor device is provided, wherein the structure is made by the methods described in any one of the above embodiments. In some embodiments, the semiconductor device is a 3D memory device. In some embodiments, the 3D memory structure comprises a memory device layer having a plurality of conductive contacts, and a first conductive layer. In some embodiments, the plurality of conductive contacts connects to the insulating layer at one end and connects to the first conductive layer at the other end.

Various embodiments in accordance with the present disclosure provide a method for forming a 3D integration wiring structure and a semiconductor device with an interconnect structure. The method for forming a 3D integrated wiring structure disclosed herein can include forming an insulating layer on a front side of a first substrate; forming a semiconductor layer on a front side of the insulating layer; patterning the semiconductor layer to expose at least a portion of a surface of the insulating layer; forming a plurality of semiconductor structures over the front side of the first substrate, wherein the semiconductor structures include a plurality of conductive contacts and a first conductive layer; joining a second substrate with the semiconductor structures; performing a thinning process on a backside of the first substrate to expose the insulating layer and one end of the plurality of conductive contacts; and forming a conductive wiring layer on the exposed insulating layer. As a result, the method for forming a 3D integrated wiring structure disclosed herein can provide an interconnect structure and enable wiring through a thick semiconductor device layer.

In some embodiments, a method for forming a 3D integrated wiring structure is disclosed. An insulating layer is formed on a front side of a first substrate. A semiconductor layer is formed on a front side of the insulating layer and patterned to expose at least a portion of a surface of the insulating layer. A plurality of semiconductor structures, including a plurality of conductive contacts and a first conductive layer, is formed over the front side of the first substrate. A second substrate is joined with the semiconductor structures followed by a thinning process on a backside of the first substrate to expose the insulating layer and one end of the plurality of conductive contacts. A conductive wiring layer is formed on the exposed insulating layer. In some embodiments, the semiconductor structure is a 3D memory structure.

In some embodiments, a 3D integrated wiring structure is disclosed. The 3D integrated wiring structure can include: an insulating layer; a patterned semiconductor layer disposed on a front side of the insulating layer; a plurality of semiconductor structures formed on at least a portion of the patterned semiconductor layer and the insulating layer, and a conductive wiring layer disposed on a backside of the insulating layer. In some embodiments, the structure further includes a first substrate on the backside of the insulating layer. In some embodiments, at least a portion of the first substrate includes a reduced thickness or is removed and at least a portion of the backside of the insulating layer is exposed. In some embodiments, the plurality of semiconductor structures includes a plurality of conductive contacts and a first conductive layer. In some embodiments, the semiconductor structure is a 3D memory structure.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A 3D NAND memory structure, comprising:
an insulating layer;
a patterned semiconductor layer disposed on a front side of the insulating layer;
a plurality of semiconductor structures formed on at least a portion of the patterned semiconductor layer and the insulating layer, wherein the plurality of semiconductor structures comprise a plurality of 3D NAND memory arrays, a plurality of conductive contacts and a first conductive layer;
a peripheral device structure formed on a substrate, wherein the substrate is bonded with the plurality of semiconductor structures such that the peripheral device structure and the plurality of 3D NAND memory arrays are disposed face to face with each other and disposed over the front side of the insulating layer; and
a conductive wiring layer disposed on a backside of the insulating layer.

2. The structure of claim 1, wherein the plurality of conductive contacts connect to the conductive wiring layer at one end and connect to the first conductive layer at the other end.

3. The structure of claim 1, wherein a thickness of the insulating layer is between about 0.3 μm and 5 μm.

4. The structure of claim 1, wherein the patterned semiconductor layer comprises single crystalline silicon, or polycrystalline silicon.

5. The structure of claim 1, wherein a thickness of the patterned semiconductor layer is between about 0.03 μm and 1 μm.

6. The structure of claim 1, wherein the plurality of conductive contacts and conductive wiring layer comprise copper, silver, aluminum, tin, tungsten, or a combination thereof.

7. The structure of claim 1, wherein a diameter of the conductive contact is between about 0.3 μm and 5 μm.

8. The structure of claim 1, wherein the plurality of 3D NAND memory arrays comprise a memory device layer having a plurality of stacked memory cells.

9. The structure claim 8, wherein a thickness of the memory device layer is between about 1 μm and 50 μm.

10. The structure of claim 8, wherein the memory device layer comprises an alternating conductor/dielectric stack and an array of NAND strings extending through the alternating conductor/dielectric stack.

11. The structure of claim 1, wherein the peripheral device structure comprises a plurality of peripheral devices, the plurality of peripheral devices comprising CMOS devices.

12. The structure of claim 1, wherein the conductive wiring layer is electrically connected to the peripheral device structure on the substrate.

* * * * *